(12) United States Patent
Tsuruta et al.

(10) Patent No.: US 6,608,745 B2
(45) Date of Patent: Aug. 19, 2003

(54) ELECTROSTATIC CHUNKS

(75) Inventors: Hideyoshi Tsuruta, Nagoya (JP); Kazuaki Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 239 days.

(21) Appl. No.: 09/756,555

(22) Filed: Jan. 8, 2001

(65) Prior Publication Data

US 2003/0095370 A1 May 22, 2003

(30) Foreign Application Priority Data

Jan. 20, 2000 (JP) ........................................ 2000-011854

(51) Int. Cl.⁷ ............................................... H02N 13/00
(52) U.S. Cl. ....................................................... 361/234
(58) Field of Search .............................. 361/234, 233; 279/128; 29/900, 825, 829; 269/8

(56) References Cited

U.S. PATENT DOCUMENTS

| | | | |
|---|---|---|---|
| 5,160,152 A | 11/1992 | Toraguchi et al. | 361/234 |
| 5,530,616 A | 6/1996 | Kitabayashi et al. | 361/234 |
| 5,583,736 A | 12/1996 | Anderson et al. | 361/234 |
| 5,777,838 A | 7/1998 | Tamagawa et al. | 361/234 |

FOREIGN PATENT DOCUMENTS

| EP | 0 791 956 A2 | 8/1997 | H01L/21/68 |
|---|---|---|---|

*Primary Examiner*—Ronald W. Leja
(74) *Attorney, Agent, or Firm*—Burr & Brown

(57) ABSTRACT

An electrostatic chuck includes a chuck body, an insulating layer formed on a surface of the chuck body and having an installation surface on which a wafer is to be installed, an inner electrode installed inside the insulating-layer, and projections projecting from the installation surface and having contact surfaces to which the wafer is to contact. A back side gas is flown into a space defined by the installation surface, the projections and the wafer, heat is supplied to the wafer, and heat of the wafer is conducted to the electrostatic chuck through the projections and the back side gas. The total area of the contact surfaces of the projections is not more than 1% of the area of the inner electrode, and the height of the projections are not less than 1 $\mu$m and not more than 10 $\mu$m.

20 Claims, 2 Drawing Sheets

ELECTROSTATIC CHUNKS

BACKGROUND OF THE INVENTION (1) Field of the Invention

The present invention relates to electrostatic chucks of the type in which the temperature of a wafer is to be controlled by transferring heat from plasma or the like to the wafer, thereby making uniform the temperature distribution of the wafer.

(2) Related Art Statement

In the electrostatic chuck, a number of projections or embossed portions are ordinarily projected from an installation surface of an insulator layer, and top surfaces (contact surfaces) of the projections are contacted with a semiconductor wafer. DC voltage is applied to an internal electrode within the insulating layer, and Johnson-Rahbeck force is generated at contact interfaces between the semiconductor wafer and the contact surfaces of the projections to attract the semiconductor wafer on the contact surfaces.

Owing to this, the attraction force for the semiconductor wafer can be enhanced by increasing the area of the contact surfaces (top surfaces) of the projections.

In the thermal CVD or etching of the semiconductor wafer, high density plasma is generated above the semiconductor wafer. In etching, the semiconductor wafer is attracted by the electrostatic chuck, and a cooling flange is provided at a lower side of the electrostatic chuck. Rise in temperature of the semiconductor wafer is prevented by releasing the heat inputted to the semiconductor wafer from the high density plasma to the electrostatic chuck. In the thermal CVD, the temperature of the semi-conductor wafer is controlled to a desired temperature by releasing the heat, which is inputted from the high density plasma to the semiconductor wafer, to the electrostatic chuck from the semiconductor wafer at a constant rate.

However, such a system for controlling the temperature of the semiconductor wafer has the following problem. That is, if heat is inputted to the semiconductor wafer from the high density plasma in the above electrostatic chuck, it is generally difficult to control the degree of the heat conduction from the semiconductor wafer to the electrostatic chuck.

In order to enhance the attracting force for the semiconductor wafer, the area of the contact surfaces of the projections needs to be increased. However, increases in the occupying ratio of the projections causes the following problem.

First, the contact state between the projections and the semi-conductor wafer changes depending upon slight variations in hardness of the contact surfaces of the projections, changes in uneven surfaces, etc., so that the heat contact resistance at the contact surface of each of the projections varies. For this reason, since heat cannot be stably released from the semiconductor wafer to the electrostatic chuck, the uniformity in the temperature of the semiconductor wafer is likely to be deteriorated.

In addition, since the contact heat conduction occurs between the semiconductor wafer and the projections, heat easily transfers between them. Therefore, if the area of the contact surfaces of the projections is increased and the temperature of the semiconductor wafer attempts to be controlled particularly to 100° C. or more, and further within a temperature range of 300° C. to 400° C., for example, the temperature of the semiconductor wafer largely decreases through the contact heat conduction form the semiconductor wafer to the projections. Consequently, the temperature of the semi-conductor wafer cannot be increased in this case.

It is considered that this problem is solved by reducing the heat transmitted from the semiconductor wafer to the electrostatic chuck via the projections through decreasing the area of the contact surface of each of the projections or through reducing the number of projections. However, in this case, the area of the portions of the semiconductor that contact the projections decreases, and the temperature distribution of the semiconductor wafer largely varies, because the amount of heat conducted through heat radiation from the semiconductor wafer to the installation surface of the electrostatic chuck is very small.

Further, this problem is to be solved by flowing a backside gas through a gap between the rear surface of the semiconductor wafer and the insulating layer under a constant pressure and transferring the heat of the semiconductor wafer to the insulating layer through heat conduction with the backside gas. In this method, the heat inputted to the semiconductor wafer transfers into the electrostatic chuck through both the contact heat conduction via contacting between the contact surfaces of the projections and the wafer and the heat conduction with the backside gas. Thereby, variations in the temperature distribution of the semiconductor wafer must be lessened.

However, if the area of the contact surfaces of the projections decreases, the Johnson-Rahbeck force acting between the contact surfaces and the semiconductor wafer decreases. Consequently, the electrostatically attracting force for the semiconductor wafer decreases.

On the other hand, when the backside gas is flown between the rear surface of the semiconductor wafer and the insulating layer under constant pressure, buoyancy acts upon the semiconductor wafer with the backside gas. Owing to this, the attracting force actually acting upon the semiconductor wafer is a value obtained by subtracting the buoyancy upon the semi-conductor wafer with the backside gas from the electrostatically attracting force acting upon the wafer from the electrostatic chuck. If the area of the contact surfaces of the projections is reduced as mentioned above, the function of the buoyancy becomes relatively large, so that the attracting force for the semiconductor wafer becomes insufficient. If the pressure of the backside gas is reduced to avoid such a problem, the heat conduction with the backside gas is insufficient to deteriorate the uniformity of the temperature of the semiconductor wafer.

SUMMARY OF THE INVENTION

It is an object of the present invention to provide an electrostatic chuck in which a backside gas is flown in the state that a wafer is attracted to the chuck, heat is inputted to the wafer and the heat of the wafer is transferred to the electrostatic chuck via projections and the backside gas and which facilitates the temperature controlling, and particularly the temperature controlling in a high temperature range for the wafer, and enhances the uniformity of the temperature of the wafer.

The present invention relates to the electrostatic chuck comprising a chuck body, an insulating layer formed on a surface of the chuck body and having an installation surface on which a wafer is to be installed, an inner electrode installed inside the insulating layer, and projections projecting from said installation surface and having contact surfaces to which the wafer is to contact, wherein a back side gas is flown into a space defined by said installation surface, said projections and said wafer, heat is supplied to the wafer, and heat of the wafer is conducted to the electrostatic chuck through the projections and the backside gas, the total area of the contact surfaces of the projections is not more than 1 % of the area of the inner electrode, and the height of the projections are not less than 1 μm and not more than 10 μm.

The present inventors largely reduced the total area of those contact surfaces of the projections which contacted the wafer to not more than 1%, thus largely reduced the ratio of the heat conduction through the contact heat conduction, and thereby facilitated the temperature controlling, particularly the temperature controlling of the semiconductor wafer.

The inventors also discovered that even if the ratio of the contact surfaces of the projections is considerably reduced like this, the heat conduction is effectively effected from the semiconductor wafer to the electrostatic chuck with the backside gas and the uniformity of the temperature of the semiconductor wafer is highly maintained by controlling the height of the projections to not less than 1 μm and not more than 10 μm.

This is further explained. In the prior art, the height of the projections of the electrostatic chuck is around 15 to 50 μm, and heat is transferred between the insulating layer and the semiconductor wafer through heat convection of the gas. Therefore, it is considered disadvantageous to lower the height of the projections from the point of view of the heat conduction.

However, it was clarified that actually controlling the height of the projections to 1 to 10 μm is advantageous for Cheat conduction from another point of view. That is, it seems that a Coulomb force acts between charges located near the surface of the insulating layer and the charges at the semiconductor wafer in addition to the attracting force originating from the Johnson-Rahbeck force at the contact area between the projections and the semiconductor wafer, and it was clarified that the electrostatically attracting force for the semiconductor wafer is not lowered beyond expectation. As a result, the present inventors succeeded in making the temperature distribution of the semiconductor wafer uniform by increasing the pressure of the backside gas between the rear surface the semiconductor wafer and the installation surface of the insulating layer and effectively perform heat conduction with the backside gas. To attain the above function and effects, it is necessary to set the height of the projections to not more than 10 μm. From the above point of view, the height of the projections is preferably not more than 8 μm.

On the other hand, it is clarified that as the height of the projections decreases, the contributory rate of the above Coulomb force increases to further enhance the electrostatically attracting force. However, if the height of the projections is less than 1 Em, the wafer is attracted to the chuck at portions other than the projections. Therefore, the height of the projections needs to be not less than 1 μm. If the height of the projections is less than 5 μm, the backside gas is unlikely to be distributed over the entire rear surface of the wafer even under elevated pressure of the backside gas, so that the efficiency of the heat conduction decreases, and the uniformity of the temperature of the semiconductor wafer deteriorates. Probably, this is considered to the effect that if the height of the projections is less than 5 μm, the heat convection has no contribution, and the heat radiation becomes predominant. From this point of view, the height of the projections is preferably not less than 5 μm.

From the point of view of further suppressing the contact heat conduction through the projections, the total area of the contact surfaces of the projections is preferably not more than 0.9 %, more preferably not more than 0.6 % of the area of the inner electrode.

From the point of view of stably supporting and attracting the wafer, the total area of the contact surfaces of the projections is preferably not less than 0.2 %, more preferably not less than 0.4 % of the area of the inner electrode.

The area of those contact surfaces of the projections which contact the wafer means an area of those contact surfaces of the projections which contact the rear surface of the wafer in ordinary attracting. This area is ordinarily equal to the total area of the top surfaces of the projections. However, if a part of the projections is lower and does not contact the rear surface of the wafer in the ordinary installation condition, for example, the area of the top surfaces of the parts of the projections is not included in the above total area.

The area of the inner electrode and that of the contact surface of the projection are both measured in a vertical direction to the installation surface.

The height of the projection is measured with a dial gauge or a three-dimensional shape measurement device.

Heat is inputted to the semiconductor with plasma, particularly preferably with die high density plasma, but heat radiation may be employed for this purpose.

These and other features, advantages will be appreciated with the understanding that some modifications, changes and variations could be made by the skilled person in the art to which pertains.

DETAILED DESCRIPTION OF THE INVENTION

Figure 1:
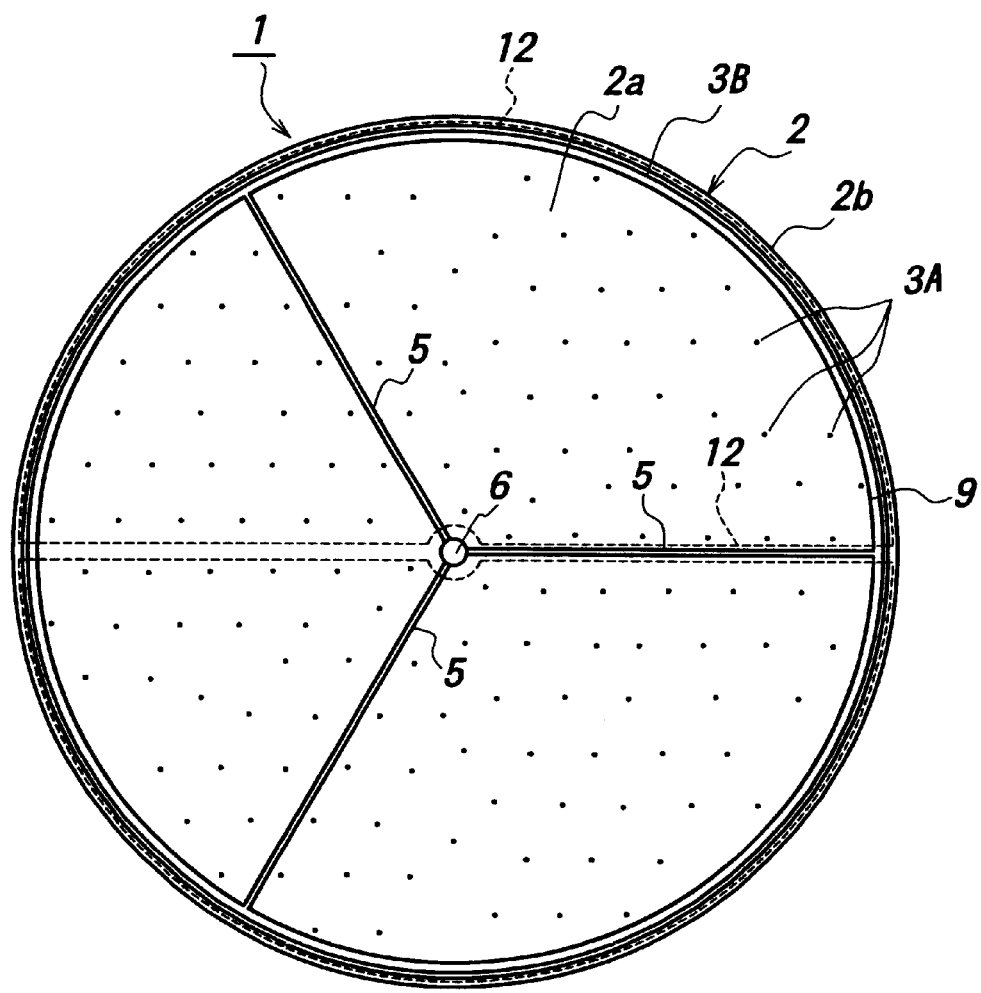
FIG. 1 is a plane view schematically illustrating an embodiment of an electrostatic chuck according to the present inventions.

An electrostatic chuck 1 includes a discoid insulating layer 2, and an inner electrode 12 buried in the insulating layer 2. A reference numeral 2a denotes a flat surface of the installation layer, and a side face (outer peripheral surface) of the insulating layer 2 is denoted by 2b. A number of projections 3A project from the installation surface 2a. Each projection has a planar shape, particularly preferably a discoid shape. Projections 3A are separated from one another, and scattered on the installation surface of the insulating layer. In this embodiment, a projection having annular shape 3B is formed near an edge (outer peripheral face) of the installation surface 2a.

A gas feed hole 6 is formed, for example, in a central portion of the insulating layer 2, and gas distributing grooves 5 are formed at the surface of the insulating layer 2 and communicate with an upper end of the gas feed hole 6. In this embodiment, the gas distributing grooves 5 radially extend in three directions from the gas feed hole 6. Further, a gas distributing groove 9 having an annular shape is formed immediately radially inside the annular projection 3B. The tip of each of the gas distributing grooves 5 communicate with the gas distributing groove 9. The grooves 5 and 9 are formed at a level lower than that of the installation surface 2a. Therefore, when the backside gas is fed to the gas feed hole 6 as shown by an arrow A, the gas enters the grooves 5 out of the gas feed hole 6 as shown by an arrow B, and flows into the groove 9. At that time, the backside gas flows into a space defined by the installation surfaced 2a, the projections 3A, 3B, and the semiconductor wafer 10 through the grooves 5 and 9.

According to the present invention, the total area of the top surfaces (contact surfaces to the semiconductor wafer) of the projections 3A, 3B is not more than 1% of the area of the inner electrode 12. Further, the height H of the projections is set at not less than 1 aim, preferably not less than 5 μm and not more than 10 μm.

In the present invention, the diameter φ of each of the projections may be changed in various ways, and the diameter φ is preferably 0.2 to 1.0 mm from the standpoint of view of the uniformity of the temperature of the wafer.

The planar shape and the planar dimension of each of the projection may be changed in various ways. For example, the contact surface of each projection may have a polygonal shape such as a triangular shape, a rectangular shape, a hexagonal shape or an octagonal shape. The number of the projections is not particularly limited. However, the number of the projections per unit area is particularly preferably 0.0025 to 0.32/mm$^2$ from the standpoint of view of make uniform the attracting force for the semiconductor wafer over the entire surface of the semiconductor wafer.

Although the material of the insulating layer is not limited, aluminum nitride-based ceramic materials, aluminum nitride-containing composite materials, alumina-based ceramic materials, alumina-containing composite materials, and composite materials containing alumina and aluminum nitride are preferred from the standpoint of view of further decreasing the occurrence of particles.

The material of the inner electrode is not particularly limited, and conductive ceramic materials and metals may be used. Metals having high melting points are particularly preferable, and molybdenum, tungsten, alloys of molybdenum and tungsten are particularly preferable.

The material of the projections is not particularly limited. Aluminum nitride-based ceramic materials, aluminum nitride-containing composite materials, alumina-based ceramic materials, alumina-containing composite materials, and composite materials containing alumina and aluminum nitride are preferred from the standpoint of view of further decreasing the occurrence of particles. The projections may be formed by blasting, chemical vapor deposition or the like.

The total area of the contact surfaces and the height of the projections are controlled as follows.

The projections are formed by lapping the installation surface of the insulating layer (a roughly working), polishing the lapped surface (super mirror working) and blasting the lapped surface (formation of the projections and the gas grooves). At the time of the blasting, a projection image corresponding the arrangement of the projections as shown in FIG. 1 is bonded to the lapped surface of the insulating layer of the electrostatic chuck, and the portion other than projections are worked by blasting. The height of the projections is controlled by adjusting the blasting time period, i.e., the height depends upon the blasting time period. The height of the projections is confirmed by the measurement with a surface roughness meter.

A known gas such as helium, argon or a mixed gas of helium and argon may be used as the backside gas.

In order to favorably effect heat conduction from the semi-conductor wafer to the electrostatic chuck, the feed pressure of the backside gas to the gas feed hole is preferably not less than 5 Torr, more preferably not less than 15 Torr. On the other hand, since too high pressure decreases the attracting force for the wafer and wafer tends to be peeled from the chuck, the feed pressure is preferably not more than 30 Torr.

EXAMPLES

Figure 2:
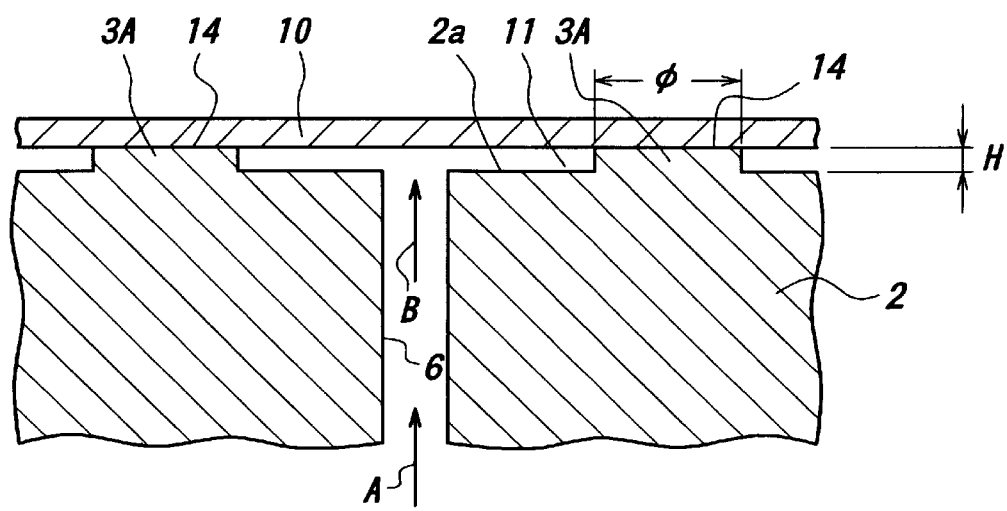
FIG. 2 is a partially enlarged sectional view of the electrostatic chuck of FIG. 1.

An electrostatic chuck fundamentally having a shape shown in FIGS. 1 and 2 was produced. More specifically, a molded body was formed by molding powdery aluminum nitride in a given shape, an inner electrode made of molybdenum was placed on the molded body, powdery aluminum nitride was filled thereon, and the resultant was molded again, thereby obtaining a discoid molded body having the inner electrode buried therein. Then, the molded body was sintered in nitrogen atmosphere, thereby forming an insulating layer 2 having a diameter of 200 mm with the inner electrode buried therein.

A number of projections 3A having a circular plane and a projection having an annular shape were formed by blasting. Gas distributing grooves 5 and 9 were formed.

The area of the inner electrode 12 was 28000 mm$^2$. The ratio of the total area of the contact surfaces 14 of the projections 3A and 3B to the area of the inner electrode 12 was changed in various ways as shown in Tables 1 and 2. Further, the height H of the projections 3A was changed as shown in Tables 1 and 2.

A silicon wafer 10 having a diameter of 200 mm was placed on an installation surface 2a of the electrostatic chuck 1. DC voltage of ±500 V was applied to the inner electrode 12 of a bipole type, thereby attracting the silicon wafer 10 upon the electrostatic chuck 1. The electrostatically attracting force for the silicon wafer was measured in terms of pressure (Torr unit). The measurement results are shown in Tables 1 and 2.

TABLE 1

| Ratio of the total area of contact surfaces of projections to the area of the inner electrode (%) | 0.6 | 0.6 | 0.6 | 0.6 | 0.6 |
|---|---|---|---|---|---|
| Height of projections (μm) | 3 | 5 | 7 | 10 | 15 |
| Applied voltage (volt) | ±500 | ±500 | ±500 | ±500 | ±500 |
| Electrostatically attracting force (Torr) | not less than 40 | not less than 40 | not less than 40 | not less than 40 | 25 |

TABLE 2

| Ratio of the total area of contact surfaces of projections to the area of the inner electrode (%) | 0.2 | 0.4 | 0.6 | 0.8 | 1.0 |
|---|---|---|---|---|---|
| Height of projections (μm) | 7 | 7 | 7 | 7 | 7 |
| Applied voltage (volt) | ±500 | ±500 | ±500 | ±500 | ±500 |
| Electrostatically attracting force (Torr) | not less than 40 | not less than 40 | not less than 40 | not less than 40 | not less than 40 |

A cooling flange was placed under the electrostatic chuck. A silicon wafer provided with a thermocouple was placed on the electrostatic chuck. A heater was placed in a space above the silicon wafer such that the heater might not directly contact the wafer. All of the cooling flange, the electrostatic chuck, the thermocouple-provided silicon wafer and heater were entirely surrounded with a reflection plate. DC voltage ±400 V was applied to the inner electrode 12, and the silicon wafer 10 was attracted upon the electrostatic chuck 1. As mentioned above, argon gas was fed into the space 11 defined among the insulating layer 2 and the projections 3A, 3B. Heat of 2500 W was inputted to the silicon wafer from the heater. The feed pressure of the backside gas is shown in Table 3. In the above state, temperatures at five locations of the silicon wafer were measured with the thermocouple, and the average temperature, the maximum temperature and the minimum temperature were determined.

TABLE 3

| | | | | | | |
|---|---|---|---|---|---|---|
| Ratio of the total area of contact surfaces of projections to the area of the inner electrode (%) | 0.6 | 0.6 | 0.6 | 0.6 | 0.6 | 0.6 |
| Height of projections (μm) | 3 | 5 | 7 | 10 | 15 | 15 |
| Applied voltage (volt) | ±400 | ±400 | ±400 | ±400 | ±400 | ±400 |
| Gas feed pressure (Torr) | 20 | 20 | 20 | 20 | 20 | 5 |
| Average temperature of wafer (° C.) | 330 | 350 | 350 | 350 | wafer peeled from the electrostatic chuck with the gas pressured | 342 |
| Difference between maximum and minimum temperatures of wafer (° C.) | ±10 | ±3 | ±2 | ±3 | | ±9 |

According to the electrostatic chuck of the present invention, the temperature controlling, particularly in a high temperature range, of the water is facilitated, so that the uniformity of the temperature of the wafer can be enhanced.

What is claimed is:

1. An electrostatic chuck comprising a chuck body, an insulating layer formed on a surface of the said chuck body and having an installation surface on which a wafer is to be installed, an inner electrode installed inside said insulating layer, and projections projecting from said installation surface and having contact surfaces to which the wafer is to contact:

wherein a back side gas is flown into a space defined by said installation surface, said projections and said wafer, heat is supplied to the wafer, and heat of the wafer is conducted to said electrostatic chuck through said projections and the back side gas; and wherein the total area of said contact surfaces of said projections is not more than 1% of the area of an upper surface of said inner electrode, and said height of said projections is in a range of 1 μm to 10 μm.

2. The electrostatic chuck set forth in claim 1, wherein the said height of said projections is not less than 5 μm.

3. The electrostatic chuck set forth in claim 2, wherein the total area of said contact surfaces of said projections is not more than 0.9 % of the area of said upper surface of said inner electrode.

4. The electrostatic chuck set forth in claim 2, wherein the total area of said contact surfaces of said projections is not less than 0.2 % of the area of said upper surface of said inner electrode.

5. The electrostatic chuck set forth in claim 2, wherein a diameter of each of said projections is in a range of 0.2 to 1.0 mm.

6. The electrostatic chuck set forth in claim 2, wherein a number of said projections per unit area is in a range of 0.0025 to 0.32/mm².

7. The electrostatic chuck set forth in claim 2, wherein said insulating layer comprises a material selected from the group consisting of aluminum nitride-based ceramic materials, aluminum nitride-containing composite materials, alumina-based ceramic materials, alumina-containing composite materials, and composite materials containing alumina and aluminum nitride.

8. The electrostatic chuck set forth in claim 2, wherein said inner electrode comprises a metal having a high melting point selected from the group consisting of molybdenum, tungsten, and alloys of molybdenum and tungsten.

9. The electrostatic chuck set forth in claim 2, wherein said projections comprise a material selected from the group consisting of aluminum nitride-based ceramic materials, aluminum nitride-containing composite materials, alumina-based ceramic materials, alumina-containing composite materials, and composite materials containing alumina and aluminum nitride.

10. The electrostatic chuck of claim 2, wherein the total area of said contact surfaces of said projections is not more than 0.6% of the area of said upper surface of said inner electrode.

11. The electrostatic chuck of claim 2, wherein the total area of said contact surfaces of said projections is not less than 0.4% of the area of said upper surface of said inner electrode.

12. The electrostatic chuck set forth in claim 1, wherein the total area of said contact surfaces of said projections is not more than 0.9 %, of the area of the said upper surface of said inner electrode.

13. The electrostatic chuck set forth in claim 1, wherein the total area of said contact surfaces of said projections is not less than 0.2 %, of the area of said upper surface of said inner electrode.

14. The electrostatic chuck set forth in claim 1, wherein a diameter of each of said projections is in a range of 0.2 to 1.0 mm.

15. The electrostatic chuck set forth in claim 1, wherein the number of said projections per unit area is in a range of 0.0025 to 0.32/mm².

16. The electrostatic chuck set forth in claim 1, wherein said insulating layer comprises a material selected from the group consisting of aluminum nitride-based ceramic materials, aluminum nitride-containing composite materials, alumina-based ceramic materials, alumina-containing composite materials, and composite materials containing alumina and aluminum nitride.

17. The electrostatic chuck set forth in claim 1, wherein said inner electrode comprises a metal having a high melting point selected from the group consisting of molybdenum, tungsten, and alloys of molybdenum and tungsten.

18. The electrostatic chuck set forth in claim 1, wherein said projections comprise a material selected from the group consisting of aluminum nitride-based ceramic materials, aluminum nitride-containing composite materials, alumina-based ceramic materials, alumina-containing composite materials, and composite materials containing alumina and aluminum nitride.

19. The electrostatic chuck of claim 1, wherein the total area of said contact surfaces of said projections is not more than 0.6% of the area of said upper surface of said inner electrode.

20. The electrostatic chuck of claim 1, wherein the total area of said contact surfaces of said projections is not less than 0.4% of the area of said upper surface of said inner electrode.

* * * * *

UNITED STATES PATENT AND TRADEMARK OFFICE
CERTIFICATE OF CORRECTION

PATENT NO. : 6,608,745 B2
DATED : August 19, 2003
INVENTOR(S) : Hideyoshi Tsuruta and Kazuaki Yamaguchi Page 1 of 1

It is certified that error appears in the above-identified patent and that said Letters Patent is hereby corrected as shown below:

Title page,
Item [54], please change "CHUNKS" to -- CHUCKS --.

Title page,
Item [57], ABSTRACT,
Line 9, please insert -- the -- before "heat".

Column 2,
Line 9, please change "decreases," to -- decreases --; and
Line 10, please change "varies," to -- varies --.

Column 3,
Line 28, please change "Cheat" to -- heat --.

Column 4,
Line 29, please change "inventions" to -- invention --.

Column 7,
Line 21, please delete "the"; and
Line 36, please delete "the".

Column 8,
Line 28, please delete "the" (second occurrence);
Line 32, please change "0.2 %," to -- 0.2 % --; and
Line 38, please change "the" to -- a --.

Signed and Sealed this

Twenty-eighth Day of October, 2003

JAMES E. ROGAN
*Director of the United States Patent and Trademark Office*